US011569075B2

United States Patent
Eidenberger-Schober et al.

(10) Patent No.: US 11,569,075 B2
(45) Date of Patent: Jan. 31, 2023

(54) SPUTTERING TARGET

(71) Applicant: PLANSEE SE, Reutte (AT)

(72) Inventors: Michael Eidenberger-Schober, Breitenwang (AT); Joerg Winkler, Breitenwang (AT); Michael O'Sullivan, Ehenbichl (AT)

(73) Assignee: Plansee SE, Reutte (AT)

( * ) Notice: Subject to any disclaimer, the term of this patent is extended or adjusted under 35 U.S.C. 154(b) by 234 days.

(21) Appl. No.: 16/337,118

(22) PCT Filed: Sep. 8, 2017

(86) PCT No.: PCT/AT2017/000062
§ 371 (c)(1),
(2) Date: Mar. 27, 2019

(87) PCT Pub. No.: WO2018/058158
PCT Pub. Date: Apr. 5, 2018

(65) Prior Publication Data
US 2019/0221408 A1    Jul. 18, 2019

(30) Foreign Application Priority Data

Sep. 29, 2016   (AT) .............................. GM 229/2016

(51) Int. Cl.
*C23C 14/34*   (2006.01)
*C22C 1/04*   (2006.01)
(Continued)

(52) U.S. Cl.
CPC ............ *H01J 37/3429* (2013.01); *B22F 3/15* (2013.01); *B22F 3/24* (2013.01); *C22C 1/045* (2013.01);
(Continued)

(58) Field of Classification Search
CPC .............. H01J 37/2426; H01J 37/3429; H01J 37/3491; C23C 14/3414; C23C 27/04;
(Continued)

(56) References Cited

U.S. PATENT DOCUMENTS 4,963,240 A    10/1990   Fukasawa et al.
7,255,757 B2 *   8/2007   Subramanian .......... C22C 27/04
                                                          148/423
(Continued)

FOREIGN PATENT DOCUMENTS

AT          13602 U2    4/2014
CN      101008076 A     8/2007
(Continued)

*Primary Examiner* — Michael A Band
(74) *Attorney, Agent, or Firm* — Laurence A. Greenberg; Werner H. Stemer; Ralph E. Locher

(57) ABSTRACT

A sputtering target containing molybdenum and at least one metal from the group tantalum and niobium. The average content of tantalum and/or niobium is from 5 to 15 at % and the molybdenum content is greater than or equal to 80 at %. The sputtering target has at least a matrix with an average molybdenum content of greater than or equal to 92 at % and particles which are composed of a solid solution containing at least one metal from the group of tantalum and niobium, and molybdenum, with an average molybdenum content of greater than or equal to 15 at % and are embedded in the matrix. There is also described a method of producing a sputtering target.

15 Claims, 1 Drawing Sheet

(51) Int. Cl.
  *C22C 27/04* (2006.01)
  *B22F 3/15* (2006.01)
  *B22F 3/18* (2006.01)
  *B22F 3/24* (2006.01)
  *H01J 37/34* (2006.01)

(52) U.S. Cl.
  CPC .......... *C22C 27/04* (2013.01); *C23C 14/3414* (2013.01); *H01J 37/3426* (2013.01); *H01J 37/3491* (2013.01); *B22F 2003/185* (2013.01); *B22F 2003/248* (2013.01); *B22F 2201/01* (2013.01); *B22F 2301/20* (2013.01); *B22F 2998/10* (2013.01)

(58) Field of Classification Search
  CPC . C23C 45/10; C23C 1/045; B22F 3/24; B22F 2003/248; B22F 2003/185; B22F 2998/10; B22F 2201/01; B22F 2301/20
  See application file for complete search history.

(56) References Cited

U.S. PATENT DOCUMENTS

| | | | |
|---|---|---|---|
| 8,409,498 | B2 | 4/2013 | Inoue et al. |
| 9,945,023 | B2 | 4/2018 | Rozak et al. |
| 2005/0191202 | A1 | 9/2005 | Iwasaki et al. |
| 2006/0172454 | A1 | 8/2006 | Reis et al. |
| 2007/0240981 | A1 | 10/2007 | Schlott et al. |
| 2012/0003486 | A1 | 1/2012 | Rozak et al. |
| 2014/0134037 | A1 | 5/2014 | Chen |
| 2015/0078950 | A1 | 3/2015 | Paliwal et al. |
| 2016/0203960 | A1 | 7/2016 | Sun et al. |
| 2016/0254128 | A1* | 9/2016 | Reinfried ................ C23C 14/14 204/298.13 |

FOREIGN PATENT DOCUMENTS

| | | |
|---|---|---|
| CN | 101283113 A | 10/2008 |
| CN | 102337418 A | 2/2012 |
| CN | 103302295 A | 9/2013 |
| CN | 103320756 A | 9/2013 |
| CN | 104439247 A | 3/2015 |
| CN | 104480437 A | 4/2015 |
| CN | 105063558 A | 11/2015 |
| CN | 105714253 A | 6/2016 |
| EP | 0285130 A1 | 10/1988 |
| JP | 2002327264 A | 11/2002 |
| JP | 2005240160 A | 2/2004 |
| JP | 2005290409 A | 10/2005 |
| JP | 2005307226 A | 11/2005 |
| JP | 2006249578 A | 9/2006 |
| JP | 2008280570 A | 11/2008 |
| JP | 2009512779 A | 3/2009 |
| JP | 2013083000 A | 5/2013 |
| JP | 2013535571 A | 9/2013 |
| WO | 2015061816 A1 | 5/2015 |

\* cited by examiner

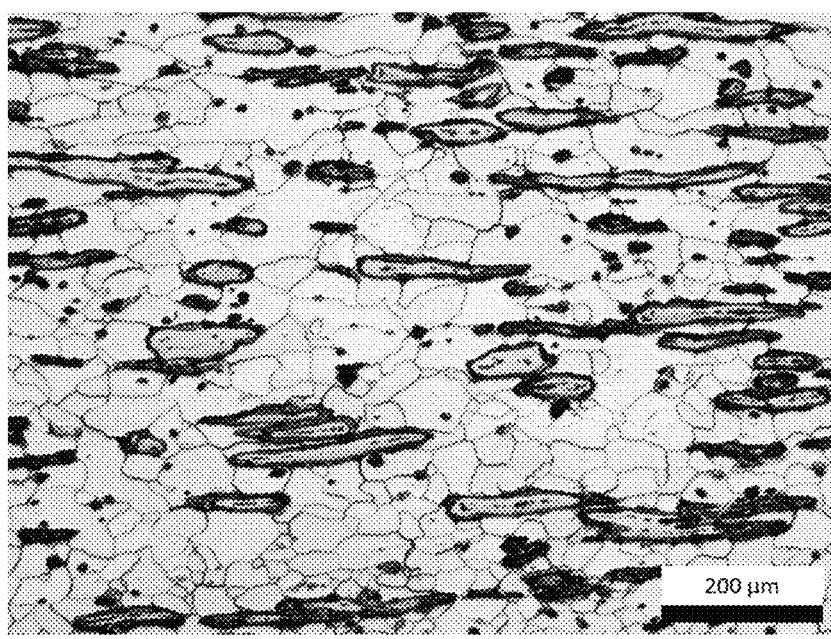

SPUTTERING TARGET

BACKGROUND OF THE INVENTION

Field of the Invention

The invention relates to a sputtering target containing molybdenum (Mo) and at least one metal from the group (tantalum, niobium), where the average content of the at least one metal from the group (tantalum, niobium) is from 5 to 15 at % and the Mo content is ≥80 at %, and also to a process for producing a sputtering target.

Sputtering, also referred to as cathode atomization, is a physical process in which atoms are detached from a sputtering target by bombardment with high-energy ions and go over into the gas phase.

Sputtering targets containing molybdenum and the metals tantalum (Ta) and/or niobium (Nb) are known from, for example, EP0285130A1, JP2002327264A, JP2005307226A or WO2015061816A1.

Molybdenum-based sputtering targets which contain the metals tantalum and/or niobium are used, for example, for the production of electrode layers for thin film transistors or of contact layers for touch panels. Meeting the increasingly demanding requirements in respect of layer quality and homogeneity at ever larger dimensions is the objective of numerous development activities.

In production by hot isostatic pressing (HIP), as described, for example, in JP2002327264A or JP2005307226A, the densification of a powder mixture is carried out in a can. Here, gases such as oxygen present in the powder mixture cannot escape, or escape only incompletely, and formation of undesirable oxides in the microstructure of the sputtering target can occur. In addition, the size of the sputtering targets which can be manufactured by means of hot isostatic pressing (HIP) is limited by the size of the available HIP plants. This limitation is even more pronounced when HIPping is carried out directly from the powder mixture, since the volume shrinkage can be from about 50 to 70%. Production by HIP has the further disadvantage that virtually no homogenization of the alloy elements occurs here. Diffusion can also be hindered by, for example, oxides.

Production by means of densification by cold isostatic pressing (CIP) and subsequent sintering (further densification at high temperature but without application of pressure) has the disadvantage that a solid solution (in the case of the present invention a solution of molybdenum and at least one metal from the group (tantalum, niobium)) is formed and the deformability of the sputtering target is greatly reduced by the solid solution reinforcement occurring here. This in turn drastically restricts the production of large-area flat targets and also tubular targets having a relatively great length.

Both production processes additionally suffer from the disadvantage that undesirable grain coarsening can occur and the homogeneity of the sputtering behaviour at the sputtering target is thus no longer sufficiently ensured. This effect is even more pronounced in production via CIP, sintering and forming since the temperatures used here are higher and a large number of defects in the microstructure are induced by a forming step, which promotes recrystallization and nonuniform grain growth.

For this reason, known sputtering targets do not meet the increasingly demanding requirements in respect of layer homogeneity, homogeneity of the sputtering behaviour and avoidance of undesirable local incipient melting. Local incipient melting is caused, for example, by arc processes (local formation of an electric arc). Furthermore, known methods do not make it possible to produce sufficiently large-area flat targets and tubular targets having a relatively great length which nevertheless additionally have a fine-grained and homogeneous microstructure.

SUMMARY OF THE INVENTION

It is therefore an object of the invention to provide a sputtering target which meets the above-described requirements and/or does not have the above-described deficiencies. In particular, it is an object of the invention to provide a sputtering target by means of which a very homogeneous layer, both in respect of chemical composition and in respect of layer thickness distribution, can be produced and which does not tend to result in local incipient melting caused by arc processes. In addition, the sputtering target should have a uniform sputtering behaviour. Here, uniform sputtering behaviour means that the individual grains or the individual regions of the sputtering target can be ablated at the same rate, so that no relief structure is formed in the region of the sputtered-off surface during the sputtering process. In addition, the sputtering target should be very large, i.e. it should be possible to provide large areas and long tubes.

It is a further object of the present invention to provide a production route for the manufacture of a sputtering target which has the abovementioned properties in a simple and reproducible and also inexpensive way.

The object is achieved by the independent claims. Particular embodiments are described in the dependent claims.

A sputtering target according to the invention contains molybdenum and at least one metal from the group (tantalum, niobium), where the average content of the metal from the group (tantalum, niobium) is from 5 to 15 at % and the molybdenum content is ≥80 at %. The sputtering target comprises at least the following constituents of the microstructure:
- a matrix having an average molybdenum content of greater than or equal to 92 at %,
- particles which are embedded in the matrix and which are composed of a solid solution containing molybdenum and at least one metal from the group (tantalum, niobium) with an average molybdenum content of greater than or equal to 15 at %.

An average content of the at least one metal from the group (tantalum, niobium) below 5 at % represents a lesser challenge for the microstructure of the target, since sputtering targets having such low contents can be homogenized more simply and also deformed more simply (lower solid solution reinforcement). However, the corrosion and etching behaviour of a layer deposited from a sputtering target having a tantalum and/or niobium content of less than 5 at % is still not satisfactory. Likewise, a tantalum and/or niobium content of more than 15 at % is not desirable since this no longer leads to a further optimization of the corrosion and etching behaviour of a layer deposited from a corresponding sputtering target. In the range of the average content of the metal from the group (tantalum, niobium) from 5 to 15 at %, an advantageous combination of good corrosion and etching behaviour and sufficiently low solid solution reinforcement can be achieved.

For the purposes of the present invention, "microstructure" means the microstructure of the sputtering target, which can be analysed in a simple manner with which a person skilled in the art will be familiar with the aid of a metallographic polished section and assessment under an optical microscope or scanning electron microscope.

In the present case, the matrix is a very molybdenum-rich phase in which particles of a tantalum- and/or niobium-rich phase are embedded. The matrix surrounds these particles and forms a contiguous structure, while the particles are spatially separated from one another. The matrix has an average molybdenum content of greater than or equal to 92 at %, which is measured as average of 5 point analyses by means of EDX (energy dispersive X-ray spectroscopy). The molybdenum content is preferably greater than or equal to 95 at %. A relatively high molybdenum content in most cases also means a lower content of tantalum and/or niobium in the matrix, which is in turn associated with lower solid solution reinforcement and thus better deformability. Larger-area sputtering targets or tubular targets having a greater length can thus be produced more easily.

The particles embedded in the matrix have a solid solution composition made up of at least one metal from the group (tantalum, niobium) and molybdenum, with the average molybdenum content being greater than or equal to 15 at %. A plurality of crystallographic grains, separated by grain boundaries, can be present in a particle. For the purposes of the present invention, a solid solution is a solid solution of at least two elements which form a joint crystal structure.

The average molybdenum content of the particles is also determined as average of 5 point analyses by means of EDX. An average molybdenum content of the particle of greater than or equal to 15 at % has been found to be particularly positive for the sputtering behaviour in respect of the homogeneity thereof. Thus, it can be established that ablation from a sputtering target according to the invention which comprises solid solution particles having a molybdenum content of greater than or equal to 15 at % occurs more homogeneously than from a sputtering target having a pure Mo phase and a pure tantalum/niobium phase.

The microstructure of the sputtering target is thus made up of at least two phases, but further additional phases such as oxides or pores can also be present therein. However, the proportion of such further phases should be as small as possible since they can have a negative effect on the sputtering behaviour, in particular the homogeneity thereof. Thus, oxides can, for example, promote the occurrence of local incipient melting (arcing).

The average molybdenum content of the particles is preferably greater than or equal to 20 at %, more preferably greater than or equal to 25 at %, since this is associated with a further improvement in the sputtering behaviour (homogeneity).

However, it is also preferred that the molybdenum content of the particles does not exceed a value of 50 at %. At a molybdenum content of the particles of less than or equal to 50 at %, the combination of only low solid solution reinforcement and thus good deformability and a very homogeneous sputtering behaviour is most pronounced.

A sputtering target according to the invention also preferably comprises no or essentially no elemental metal from the group (tantalum, niobium). This means that no, or essentially no, particles consisting only of tantalum and/or niobium are present in the microstructure of the sputtering target. The absence of such elemental particles can be confirmed or demonstrated in a simple manner by means of X-ray diffraction (XRD) by recording of an XRD spectrum on a metallographic polished section. Particularly homogeneous sputtering ablation from a sputtering target according to the invention is ensured in this way.

Furthermore, a sputtering target according to the invention preferably has a forming texture. A forming texture is formed in a forming (deformation) process such as a rolling, forging or extrusion process. As a result of a forming process, the crystallographic grains present in the sputtering target are preferably aligned in the same or similar orientation relative to the surface of the sputtering target. A forming texture is also maintained during a heat treatment after the forming process, for example an annealing or recrystallization heat treatment. A sputtering target which has a forming texture displays a further-improved, more homogeneous sputtering behaviour since the ablation rate is also dependent on the crystallographic orientation of the individual grains. It is particularly advantageous for both the matrix and the particles which are present in a sputtering target according to the invention to have the following dominant orientations:

a. in the forming direction: (110)
    b. in the normal direction: at least one orientation from the group (100) and (111).

Here, the forming direction (often referred to as "rolling direction") in the case of a rolling process is the rolling direction or in the case of a radial forging process is the direction of advance. For the purposes of the present invention, the normal direction is the deformation direction, i.e. in the case of a rolling process is the direction of the normal to the surface or in the case of a radial forging process is the radial direction. "Dominant" refers to the orientation having the highest intensity. The intensity is typically greater than 1.5 times, preferably 2 times, the background intensity. The forming texture is determined by means of SEM (scanning electron microscopy) and EBSD (electron backscatter diffraction). The specimen is for this purpose installed at an angle of 70°. The incident primary electron beam is scattered inelastically at the atoms of the specimen. When some electrons impinge on lattice planes in such a way that the Bragg condition is satisfied, constructive interference occurs. This reinforcement occurs for all lattice planes in the crystal, so that the resulting electron backscatter pattern (also referred to as Kikuchi pattern) indicates all angle relationships in the crystal and thus also the crystal symmetry. The measurement is carried out under the following conditions:

accelerating voltage: 20 kV,
    orifice 120 µm,
    working distance 15 mm
    high current mode—activated
    scanned area: 800×800 µm$^2$.
    indexing step: 0.5 µm.

The particles in a sputtering target according to the invention more preferably have an average aspect ratio of greater than or equal to 2, even more preferably greater than or equal to 3, very particularly preferably greater than or equal to 5.

The average aspect ratio can be measured in a simple manner on an optical micrograph of a metallographic polished section. Such average aspect ratios are advantageous since excessive or nonuniform grain growth of the matrix can be reduced or inhibited by particles having such a configuration.

It is also particularly advantageous for the average distance between the particles perpendicular to the forming direction (in the normal direction) in the microstructure of the sputtering target to be less than or equal to 250 µm, preferably less than or equal to 150 µm, more preferably less than or equal to 100 µm, even more preferably less than or equal to 50 µm. Here, the distance is in each case measured between the particle centres (perpendicular to the forming direction) on an optical micrograph of a metallographic polished section. Five lines having a length of 780 µm are here placed equidistantly perpendicular to the forming direction over an optical micrograph (1040×780 μm). The average distance between the particles which can be set in a sputtering target according to the invention naturally also depends on the content of the metal from the group (tantalum, niobium). Thus, the average distance achievable at a content of 5 at % is greater than at 15 at % of metal from the group (tantalum, niobium). The average distance between the particles also correlates very well with the maximum average grain size of the matrix.

It is also advantageous for the matrix in a sputtering target of the invention to have, at least partly, a recrystallized microstructure. A recrystallized microstructure results from the removal of lattice defects (e.g. dislocations) and also nucleus formation and growth. New grains are formed during recrystallization. Thus, at least partly recrystallized can mean that the matrix is partly also present in the deformed state, partly recovered (rearrangement of lattice defects), partially recrystallized or else fully recrystallized. A recrystallized microstructure continues to display the previously introduced forming texture but has fine globular grains. A microstructure having such a configuration enables the advantages of preferential orientation (like and preferably sputtering orientations parallel to the sputtering surface of the sputtering target) to be combined in an optimal way with fine, globular grains (homogeneous sputtering ablation). Residual stresses in the material can also be dissipated in a particularly advantageous way by means of an at least partially recrystallized matrix. As a result, the distortion arising during sputtering-off of material, in particular from flat targets, during use of a sputtering target according to the invention can be reduced or even entirely avoided. It is presumed that such distortion arises from elimination of stresses.

A recrystallized microstructure usually incurs the risk of undesirable grain coarsening which can, in a particularly undesirable way, also be inhomogeneous (nonuniform grain growth). In a sputtering target according to the invention in which solid solution particles having an average molybdenum content of greater than or equal to 15 at % are present in addition to the matrix, this grain coarsening is very largely suppressed. The particles here act as obstacles for the grain boundaries of the matrix which migrate during a recrystallization process. This effect is particularly pronounced when the particles have an elongated shape as described above with a corresponding average aspect ratio. These elongated particles act as "fences" and hinder excessive undesirable grain growth/grain coarsening in a particularly efficient way. It is therefore possible to achieve an optimized fine-grained microstructure which leads to particularly homogeneous sputtering.

It is also advantageous for the average particle size of the matrix in a sputtering target according to the invention to be less than or equal to 100 μm, preferably less than or equal to 60 μm. The average particle size can be evaluated in a simple manner by means of a line section method on an optical micrograph of a metallographic longitudinal polished section (forming direction and normal direction span the plane of the image). For this purpose, the longitudinal polished section is prepared by means of Murakami etching in order to make the grain boundaries visible. At an enlargement of 100× (image section 1040×780 μm), five lines are in each case placed at equidistant intervals from image edge to image edge in the image and the grain size is measured in both directions (forming direction and normal direction) and the average is formed.

An average grain size of less than or equal to 100 μm, preferably 60 μm, is advantageous because a more homogeneous sputtering behaviour compared to coarser microstructures can be achieved thereby.

It is likewise particularly advantageous for at least some of the particles in a sputtering target according to the invention to have a recrystallized microstructure. The forming texture of the particles is likewise maintained here, as is their elongated shape, but the grain structure in the interior of the particles is in this case at least partially fine and globular. The homogeneity of sputtering ablation can be improved further in this way. It is very particularly advantageous for both the matrix and the particles in a sputtering target according to the invention to have an at least partially recrystallized microstructure.

In a sputtering target according to the invention, the oxygen content is preferably ≤0.5 at %, corresponding to a value of 800 ppm by weight. Too high an oxygen content can lead to formation of undesirable oxides which in turn can have an adverse effect on the sputtering behaviour. Thus, oxides can, for example, promote the occurrence of local incipient melting (arcing).

It is therefore advantageous for the oxygen content in the sputtering target of the invention to be kept low so as to largely prevent formation of undesirable oxides. However, the oxygen content cannot be reduced further during consolidation, especially in the case of production by HIP, and a certain proportion of oxides remains in the microstructure of the sputtering target. Since oxides can also weaken the interfaces between the particles present in the microstructure and the matrix and thus reduce the deformability, it is also particularly advantageous for these interfaces between matrix and particles to be substantially free of oxides. However, oxides can be present in the interior of the particles in such a microstructure. Oxides present in the interior of the particles do not lead to any reduction in the deformability, i.e. are not a hindrance to the production of large-area targets or long tubular targets.

The relative density of a sputtering target according to the invention is preferably greater than or equal to 98.5% of the theoretical density. Thus, pores can also be present in the microstructure of the sputtering target, but the porosity is preferably less than 1.5%. A high relative density combined with a low oxygen content ensures particularly arc-free sputtering. The determination of the density is carried out using the Archimedes principle, which describes the relationship between mass, volume and density of a solid body immersed in liquid. The weight minus the buoyancy force is determined by the buoyancy method and the relative density is calculated from this and from the weight of air. Here, the relative density is the measured density based on the theoretical density of the respective material. The theoretical density of a material corresponds to the density of pore-free, 100% dense material.

In a further advantageous embodiment, the composition of the sputtering target consists of from 5 to 15 at % of at least one metal from the group (tantalum, niobium), balance Mo and typical impurities. For the purposes of the present invention, typical impurities are both impurities which are routinely present in the raw materials or are attributable to the production process. In this case, the sputtering target therefore consists of a binary alloy of Mo—Nb or Mo—Ta. Compared to alloys having additional constituents or elements, such alloys have a cost advantage. Furthermore, the solid solution reinforcement which occurs is usually lower and the deformability is thus better.

Particular preference is given to the metal of the group (tantalum, niobium) in a sputtering target according to the invention being niobium. Mo—Nb alloys have particularly advantageous corrosion and etching behaviour and are in addition cheaper than Mo—Ta alloys.

Particular preference is given to a sputtering target according to the invention to be configured as tubular target. Larger areas can be coated by means of a tubular target and the materials utilization of the sputtering target in the sputtering process is higher.

A sputtering target according to the invention can be produced in a particularly simple and reproducible way when the process comprises the following steps:
i. production of a powder mixture containing more than or equal to 80 at % of Mo and powder of at least one metal from the group (tantalum, niobium), where the average content of the metal from the group (tantalum, niobium) in the powder mixture is from 5 to 15 at %;
ii. consolidation of the powder mixture by HIP
iii. at least one heat treatment step.

To prepare for the consolidation by means of HIP, the powder mixture is introduced into a can (typically made of steel) and the latter is closed. Consolidation by HIP (hot isostatic pressing) is typically carried out at temperatures in the range from 1000 to 1600° C. and pressures in the range from 80 MPa to 200 MPa.

The at least one heat treatment step as part of the process of the invention is carried out at a suitable combination of pressure and temperature, so that the inventive microstructure, i.e. containing at least a matrix having an average molybdenum content of greater than or equal to 92 at % and particles which are composed of a solid solution containing at least one metal from the group (tantalum, niobium) and molybdenum, with an average molybdenum content of greater than or equal to 15 at %, and are embedded in the matrix, is formed. This is ensured by deliberate interdiffusion of molybdenum and the at least one metal from the group (tantalum, niobium).

In addition to the process steps mentioned, one or more forming steps can additionally be carried out. Such a forming step can take place either between (ii) consolidation and (iii) heat treatment, after (iii) the heat treatment or else before and after this. The size of the sputtering target can be increased considerably by means of a forming step and further densification can occur. Forming can, for example in the case of flat targets, be effected by rolling, in the case of tubular targets by extrusion or forging.

The preferred degree of deformation is from 45 to 90%. The degree of deformation is defined as follows:

$(A_a - A_u)/A_a \times 100$ (in %)

$A_a$ . . . cross-sectional area before forming
$A_u$ . . . cross-sectional area after forming At degrees of deformation of <45%, the density of the sputtering target and uniformity of the sputtering behaviour can be influenced in an unfavourable way. Degrees of deformation of >90% can have an unfavourable effect on the manufacturing costs. The forming temperature is preferably from 900° C. to 1500° C. for at least some of the time. For the present purposes, some of the time means that, for example, the first forming steps are carried out at this temperature. The forming temperature after this can also be below 900° C. Forming can be carried out either in one step or in a plurality of steps.

The at least one heat treatment step preferably takes place in a temperature range from 1300° C. to 1900° C. At temperatures below 1300° C., the process times necessary for formation of the microstructure according to the invention are relatively long and therefore not very economical. At temperatures above 1900° C., the process stability can be reduced by the very rapid interdiffusion. For example, it is possible for the molybdenum content in the particles to rise too quickly and an excessively high solid solution reinforcement to occur. Greater preference is given to a temperature range from 1450° C. to 1750° C., in which particularly good economics and particularly advantageous microstructure formation can be achieved.

Preference is given to the at least one heat treatment step having a duration in the range from 1 to 10 hours. In this time window, a particularly optimal combination of economics and process stability is obtained.

Employing the abovementioned temperature ranges and periods of time ensures, in an optimal manner, that at least one of the following effects is achieved:
Oxygen removal.
Transport of the oxygen and/or of oxides away from the interfaces between matrix and particles.
"Making oxides uniform", namely changing the morphology from sharp-edged to round.
Formation of a matrix having an average molybdenum content of greater than or equal to 92 at % and particles which are composed of a solid solution containing at least one metal from the group (tantalum, niobium) and molybdenum, with an average molybdenum content of greater than or equal to 15 at %, and are embedded in the matrix.
Recrystallization of the matrix, the particles or matrix and particles.

Further preference is given to the at least one heat treatment step taking place in a reducing atmosphere, for example in hydrogen or a hydrogen/nitrogen mixture. The use of a reducing atmosphere enables the oxygen content to be reduced further. As an alternative, it is possible to carry out the at least one heat treatment step under reduced pressure or in an inert atmosphere (for example Ar) or else in a nitrogen atmosphere.

BRIEF DESCRIPTION OF THE DRAWING

The invention is illustrated by way of example below with the aid of two production examples:

The FIGURE shows an etched (Murakami) longitudinal polished section of a sputtering target according to the invention. Forming direction and normal direction span the plane of the image and are marked by arrows.

DESCRIPTION OF THE INVENTION

Example 1

To produce a sputtering target according to the invention, the following powders were used:
Mo powder having a Fisher particle size of 4.7 µm, an oxygen content of 0.035% by weight and a carbon content of 0.0018% by weight
Nb powder having a Fisher particle size of 7.8 µm, an oxygen content of 0.19% by weight and a carbon content of 0.05% by weight To produce four plates composed of a molybdenum alloy with 10 at % of niobium (corresponds to 9.71% by weight of niobium) and each having a weight of 450 kg, 185 kg of niobium powder and 1615 kg of molybdenum powder were mixed in a mechanical mixer for 20 minutes. The powder mixture was canned in steel cans and hot isostatically pressed (HIP). At an HIP temperature of 1200° C. for 5 hours at a pressure of 100 MPa, full densification of the powder was achieved.

The HIPped plates were rolled at 1250° C. on a hot rolling apparatus at a total degree of deformation of 84% to a length of 2.5 m and a width of about 1 m. The rolled plates were then heat treated at 1550° C. for 3 hours in a hydrogen atmosphere in a furnace.

Samples were taken from the sputtering targets produced in this way and were ground, polished and etched by means of conventional metallographic methods.

For all of the following analytical methods, a longitudinal sample (forming direction and normal direction spanning the plane of the image) was taken from each sputtering target, a picture having a magnification of 100× and an image section of 1040 μm×780 μm was taken and the averages in each case were determined therefrom (The FIGURE shows such an image section by way of example).

To determine the average molybdenum content in the particles or in the matrix, the sample was measured by means of EDX in a scanning electron microscope.

Table 1 shows the average molybdenum contents of the particles and of the matrix (determined as average of five measurements in each case).

TABLE 1

|  | Mo content in particles | Mo content in matrix |
|---|---|---|
| Measurement point 1 | 32.1 at % | 95.5 at % |
| Measurement point 2 | 21.4 at % | 93.7 at % |
| Measurement point 3 | 16.3 at % | 92.3 at % |
| Measurement point 4 | 29.2 at % | 92.9 at % |
| Measurement point 5 | 24.4 at % | 94.1 at % |
| Average | 24.7 at % | 93.7 at % |

To determine the grain size of the matrix, the line section method using five lines of 780 μm each at equidistant spacings in the forming direction and the normal direction was employed. The grain size was calculated from the average of the two directions and from the average of the four images (one per sputtering target (plate)) and was 52 μm.

As further parameter for the microstructure present, the average aspect ratio of the solid solution particles (in this example Nb-rich particles) was determined. For this purpose, all particles which have a length of greater than or equal to 10 μm in the forming direction were measured in the forming direction and the normal direction and the ratio of the two lengths was calculated. The particles had an average length in the forming direction of 144 μm and in the normal direction of 22 μm, giving an average aspect ratio of 6.4.

The distance between the Nb-rich particles in the normal direction (perpendicular to the forming direction) was likewise determined by means of line section methods. For this purpose, five lines each having a length of 780 μm were laid with equidistant spacings over the image and the average distance between the particles (particle periphery to particle periphery in the normal direction) was determined and found to be 81 μm.

The sputtering behaviour of the sputtering targets produced as described above was determined by means of sputtering experiments at Ar (argon) pressures in the range from $2.5 \times 10^3$ to $1 \times 10^{-2}$ mbar and a power of 400 or 800 watt. Soda-lime glass was used as substrate material. The sputtering targets could be sputtered without the occurrence of arc processes.

Example 2

To produce a tubular MoNb sputtering target, the following powders were used:

Mo powder having a Fisher particle size of 4.9 μm, an oxygen content of 0.039% by weight and a carbon content of 0.0022% by weight Nb powder having a Fisher particle size of 7.8 μm, an oxygen content of 0.19% by weight and a carbon content of 0.05% by weight To produce two tubes composed of a molybdenum alloy with 10 at % of niobium (corresponds to 9.71% by weight of niobium) and having a weight of 420 kg, 87 kg of niobium powder and 753 kg of molybdenum powder were mixed for 20 minutes in a mechanical mixer. The powder mixture was canned in tubular steel cans and hot isostatically pressed (HIP). At an HIP temperature of 1250° C. for 4 hours at a pressure of 105 MPa, full densification of the powder was achieved.

The HIPped tubes were removed from the cans and forged at 1250° C. to a degree of deformation of 30% on a radial forging plant. The forged tubes were subsequently heat treated at 1500° C. for 5 hours and subsequently forged a second time at 1200° C. with a degree of deformation of 30% in a second forging step to give tubular sputtering targets having a length of 3 m.

A longitudinal sample (forming direction/direction of advance and normal direction/radial direction span the plane of the image) was taken from each of the two tubular sputtering targets and ground, polished and etched by means of conventional metallographic methods.

To determine the average molybdenum content in the particles and in the matrix, the sample was measured by means of EDX in a scanning electron microscope.

Table 2 shows the average molybdenum contents of the particles and of the matrix (determined as average of five measurements in each case).

TABLE 2

|  | Mo content in particles | Mo content in matrix |
|---|---|---|
| Measurement point 1 | 22.1 at % | 98.6 at % |
| Measurement point 2 | 14.3 at % | 97.3 at % |
| Measurement point 3 | 17.8 at % | 95.5 at % |
| Measurement point 4 | 19.2 at % | 98.2 at % |
| Measurement point 5 | 21.0 at % | 99.1 at % |
| Average | 18.9 at % | 97.7 at % |

At a magnification of 100× and an image section of 1040 μm×780 μm, the particle size of the matrix was determined by means of line section methods. Here, five lines each having a length of 780 μm were in each case used at equidistant spacings in the forming direction and the normal direction. The grain size was calculated from the average of the two directions and the two samples and was 59 μm.

As further parameter for the microstructure present, the average aspect ratio of the solid solution particles (in this example Nb-rich particles) was determined. For this purpose, all particles which have a length in the forming direction of greater than or equal to 10 μm were measured in the forming direction and the normal direction and the ratio of the two lengths was calculated. The particles had an average length in the forming direction of 101 μm and in the normal direction of 20 μm, giving an average aspect ratio of 5.

The distance between the Nb-rich particles in the normal direction (perpendicular to the forming direction) was likewise determined by means of line section methods. For this purpose, five lines each having a length of 780 μm were laid at equidistant spacings over the image and the average distance between the particles (particle periphery to particle periphery) was determined and found to be 97 µm.

The invention claimed is:

1. A sputtering target, comprising:
   molybdenum and at least one metal selected from the group consisting of tantalum and niobium;
   an average content of said at least one metal selected from the group consisting of tantalum and niobium lying between 5 and 15 at %, and a molybdenum content being greater than or equal to 80 at %;
   wherein a microstructure of the sputtering target is defined by:
   a matrix having particles selected from the group consisting of: a tantalum-rich phase, a niobium-rich phase, and a tantalum-and-niobium-rich phase, said matrix having an average molybdenum content of greater than or equal to 92 at % surrounding said particles and forming a contiguous structure; and
   interfaces between said matrix and said particles which are free of oxides;
   said particles embedded in said matrix being spatially separated from one another and having a crystal composition made up of:
   molybdenum with an average molybdenum content of greater than or equal to 15 at % and less than or equal to 50 at %, and at least one metal selected from the group consisting of tantalum and niobium;
   wherein said matrix at least partially comprises a recrystallized microstructure; and
   wherein said particles at least partially have a recrystallized microstructure.

2. The sputtering target according to claim 1, wherein the average molybdenum content of said particles is greater than or equal to 20 at % and less than or equal to 50 at %.

3. The sputtering target according to claim 2 wherein the average molybdenum content of said particles is greater than or equal to 25 at % and less than or equal to 50 at %.

4. The sputtering target according to claim 1, wherein the target has a forming texture in which at least one of said matrix or said particles has the following predominant orientations:
   in a forming direction (110);
   in a normal direction: at least one orientation selected from the group consisting of (100) and (111).

5. The sputtering target according to claim 1, wherein said particles have an average aspect ratio of greater than or equal to 2.

6. The sputtering target according to claim 5, wherein the average aspect ratio is greater than or equal to 5.

7. The sputtering target according to claim 1, wherein an average distance between said particles perpendicular to a forming direction is less than or equal to 250 µm.

8. The sputtering target according to claim 1, wherein an average distance between said particles perpendicular to a forming direction is less than or equal to 50 µm.

9. The sputtering target according to claim 1, wherein an average grain size of said matrix is less than or equal to 100 µm.

10. The sputtering target according to claim 9, wherein the average grain size of said matrix is less than or equal to 60 µm.

11. The sputtering target according to claim 1, consisting of from 5 to 15 at % of said at least one metal selected from the group consisting of tantalum and niobium, balance Mo, and typical impurities.

12. The sputtering target according to claim 1, wherein said metal is niobium.

13. A method of producing the sputtering target according to claim 1, the method comprising the following steps:
   producing a powder mixture with a molybdenum content of greater than or equal to 80 at % and powder of said at least one metal selected from the group consisting of tantalum and niobium with an average content of between 5 and 15 at %;
   consolidating the powder mixture by hot isostatic pressing; and
   performing at least one heat treatment step in a temperature range from 1300° C. to 1900° C. for a duration in a range from 1 to 10 hours such that said microstructure of the sputtering target is defined by:
   said matrix having said particles selected from the group consisting of: said tantalum-rich phase, said niobium-rich phase, and said tantalum-and-niobium-rich phase, said matrix having the average molybdenum content of greater than or equal to 92 at %; and
   said interfaces between said matrix and said particles which are free of oxides;
   said particles being embedded in said matrix, said particles being spatially separated from one another and having said crystal composition made up of molybdenum with the average molybdenum content of greater than or equal to 15 at % and less than or equal to 50 at %, and the at least one metal selected from the group consisting of tantalum and niobium;
   wherein said matrix at least partially comprises said recrystallized microstructure;
   wherein said particles at least partially have said recrystallized microstructure; and
   wherein the at least one heat treatment step causes oxides to be transported away from said interfaces between said matrix and said particles resulting in said interfaces between said matrix and said particles being free from oxides.

14. The method according to claim 13, further comprising performing at least one forming step either:
   between the consolidating step and the at least one heat treatment step;
   after the at least one heat treatment step; or
   before and after the at least one heat treatment step.

15. The method according to claim 13, which comprises performing the at least one heat treatment step in a reducing atmosphere.

* * * * *